United States Patent
Vermeulen et al.

(10) Patent No.: US 9,052,612 B2
(45) Date of Patent: Jun. 9, 2015

(54) SUPPORT STRUCTURE, LITHOGRAPHIC APPARATUS AND METHOD

(75) Inventors: Marcus Martinus Petrus Adrianus Vermeulen, Leende (NL); Johannes Henricus Wilhelmus Jacobs, Eindhoven (NL); Joost Jeroen Ottens, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 684 days.

(21) Appl. No.: 12/466,119

(22) Filed: May 14, 2009

(65) Prior Publication Data

US 2009/0290137 A1    Nov. 26, 2009

Related U.S. Application Data (60) Provisional application No. 61/071,913, filed on May 23, 2008, provisional application No. 61/129,509, filed on Jul. 1, 2008.

(51) Int. Cl.

| | |
|---|---|
| *G03B 27/58* | (2006.01) |
| *G03B 27/62* | (2006.01) |
| *G03F 7/20* | (2006.01) |
| *G03F 1/66* | (2012.01) |
| *G03B 27/53* | (2006.01) |

(52) U.S. Cl.
CPC ........ *G03F 7/70691* (2013.01); *G03F 7/70733* (2013.01); *G03F 1/66* (2013.01); *G03B 27/53* (2013.01); *G03F 7/707* (2013.01); *G03F 7/70716* (2013.01); *G03F 7/708* (2013.01)

(58) Field of Classification Search
CPC .... G03F 1/66; G03F 7/70691; G03F 7/70733
USPC ................................ 355/72, 74, 75
See application file for complete search history.

(56) References Cited

U.S. PATENT DOCUMENTS

| | | | |
|---|---|---|---|
| 5,266,119 A | 11/1993 | Taniguchi et al. | |
| 6,216,873 B1* | 4/2001 | Fosnight et al. | ............ 206/710 |
| 7,064,808 B1 | 6/2006 | Gilissen et al. | |
| 2005/0117142 A1* | 6/2005 | Heerens et al. | ............... 355/75 |
| 2007/0002516 A1* | 1/2007 | Matsumoto | ................... 361/234 |

FOREIGN PATENT DOCUMENTS

| | | |
|---|---|---|
| EP | 03076171.2 | 4/2003 |
| JP | 11142555 A1 | 5/1999 |

* cited by examiner

*Primary Examiner* — Glen Kao
(74) *Attorney, Agent, or Firm* — Pillsbury Winthrop Shaw Pittman LLP (57) ABSTRACT

A support structure for supporting an exchangeable object in a lithographic exposure apparatus includes a first support structure part and a second support structure part, the first support structure part being arranged to support the object, and the second support structure part being arranged to, at least in part, support the first support structure part. At least one of the first support structure part and the second support structure part has an open-box structure. The first support structure part and the second support structure part are configured to be attached to one another in such a way that the first support structure part and the second support structure part together form a closed-box structure.

20 Claims, 7 Drawing Sheets

SUPPORT STRUCTURE, LITHOGRAPHIC APPARATUS AND METHOD

RELATED APPLICATIONS

The present invention claims benefit under 35 U.S.C. §119 (e) from U.S. Provisional Application No. 61/129,509 filed on Jul. 1, 2008 and U.S. Provisional Application No. 61/071,913 filed on May 23, 2008, each of which is incorporated herein by reference in its entirety.

FIELD

The present invention relates to a support structure, a lithographic apparatus and a method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

In commercial lithographic apparatus, for example steppers and scanners, it is often necessary to move the substrate and/or patterning device within the lithographic apparatus. For instance, in a scanner the substrate and the patterning device may be moved simultaneously and in opposite directions in order to apply a pattern to the substrate. In a stepper, the substrate will need to be moved so that different target portions of the substrate can be exposed to radiation. It is desirable to ensure that the throughput of a lithographic apparatus is as high as possible. In order to maximize throughput, it is often necessary to move the substrate and/or patterning device as fast as possible from a first position to a second position. For example, the first position of the substrate may be such that a first target portion of the substrate is in position to be exposed to a radiation beam, and a second position may be when a second target portion of the substrate is arranged to be in position to be exposed to a radiation beam. In order to move the substrate and/or patterning device as fast as possible, the acceleration of the substrate and/or patterning device will be high. The higher the acceleration of the substrate and/or patterning device, the higher the (accelerating) force acting on the substrate and/or patterning device and apparatus holding the substrate and/or patterning device.

In an existing lithographic apparatus, the lithographic apparatus comprises an arrangement for holding a substrate in position, for example a substrate support structure. The arrangement may comprise two parts: a first part which holds the substrate, and a second part which holds or supports the first part. The first part is often referred to as a wafer table, and second part is often referred to as a chuck or mirrorblock. The first part and the second part may be clamped together using a vacuum clamp arrangement. As discussed above, the arrangement may undergo high acceleration. Such high acceleration can cause the first part of the arrangement to slip relative to the second part of the arrangement, or cause distortion in one or both of the parts. Such slip or distortion can result in the substrate, and therefore target portions of the substrate, being misaligned with respect to the radiation beam. Such misalignment can cause patterns to be inaccurately applied to the substrate, and if the misalignment is not consistent when patterns are overlaid on top of one another, overlay errors can also arise.

Similarly, in an existing lithographic apparatus, the lithographic apparatus comprises an arrangement for holding a patterning device in position, for example a patterning device support structure. The arrangement may comprise two parts: a first part which holds the patterning device, and a second part which holds or supports the first part. The first part and the second part may be clamped together using a vacuum clamp arrangement. The patterning device support arrangement may also undergo high acceleration, for example in a scanning lithographic apparatus. Such high acceleration can cause the first part of the arrangement to slip relative to the second part of the arrangement, or cause distortion in one or both of the parts. Such slip or distortion can result in misalignment of the patterning device, and therefore misalignment of patterns applied to target portions of the substrate.

It is desirable to provide, for example, a support structure, a lithographic apparatus and method that obviates or mitigates one or more of the problems of the prior art identified above.

SUMMARY

According to an aspect of the invention there is provided a support structure for supporting an exchangeable object in a lithographic exposure apparatus including a first support structure part and a second support structure part, the first support structure part being arranged to support the object, and the second support structure part being arranged to, at least in part, support the first support structure part, at least one of the first support structure part and the second support structure part having an open-box structure, and wherein the first support structure part and the second support structure part are configured to be attached to one another in such a way that the first support structure part and the second support structure together form a closed-box structure.

According to a further aspect of the invention there is provided a lithographic exposure apparatus for exposing the substrate to a patterned beam of radiation, comprising a support structure according to the invention.

According to yet another aspect of the invention there is provided a method of attaching together first and second parts of a support structure for use in a lithographic apparatus to support an exchangeable object, the first support structure part being arranged to support an object, and the second support structure part being arranged to, at least in part, support the first support structure part, at least one of the first support structure part and the second support structure part having an open-box structure, and wherein the method includes attaching the first and second parts of the support structure to one another in such a way that the first support structure part and the second support structure part together form a closed-box structure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The patterning device support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The patterning device support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

Figure 1:
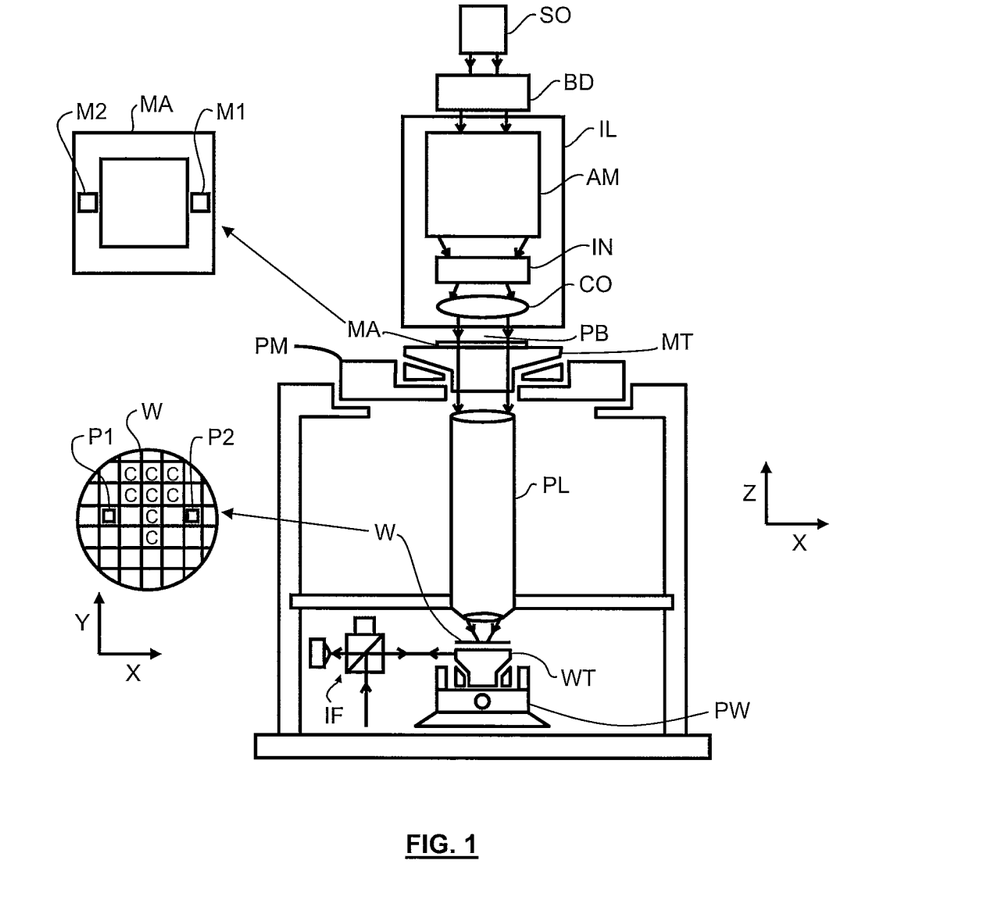
FIG. 1 schematically depicts a lithographic apparatus.

FIG. 1 schematically depicts a lithographic apparatus according to a particular embodiment.

an illumination system (illuminator) IL to condition a beam PB of radiation (e.g. UV, DUV, EUV radiation or radiation having a shorter wavelength).

a patterning device support structure (e.g. comprising a mask table) MT to support a patterning device (e.g. a mask) MA and connected to first positioning device PM to accurately position the patterning device with respect to item PL;

a substrate support structure (e.g. comprising a wafer table) WT for holding a substrate (e.g. a resist-coated wafer) W and connected to second positioning device PW for accurately positioning the substrate with respect to item PL; and a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjustable optical component AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross-section.

The radiation beam PB is incident on the patterning device (e.g. mask) MA, which is held on the patterning device support structure MT. Having traversed the patterning device MA, the beam PB passes through the lens PL, which focuses the beam onto a target portion C of the substrate W. With the aid of the second positioning device PW and position sensor IF (e.g. an interferometric device), the substrate support structure WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the patterning device support structure MT and substrate support structure WT will be realized with the aid of a long-stroke module (coarse positioning) and a short-stroke module (fine positioning), which form part of the positioning device PM and PW. However, in the case of a stepper (as opposed to a scanner) the patterning device support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following modes:

1. In step mode, the patterning device support structure MT and substrate support structure WT are kept essentially stationary, while an entire pattern imparted to the beam PB is projected onto a target portion C in one go (i.e. a single static exposure). The substrate support structure WT is then shifted in the X and/or Y direction so that a different target portion C can be exposed. In step mode, the maximum size of the exposure field limits the size of the target portion C imaged in a single static exposure.

2. In scan mode, the patterning device support structure MT and substrate support structure WT are scanned synchronously while a pattern imparted to the beam PB is projected onto a target portion C (i.e. a single dynamic exposure). The velocity and direction of the substrate support structure WT relative to the patterning device support structure MT is determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support structure MT is kept essentially stationary holding a programmable patterning device, and the substrate support structure WT is moved or scanned while a pattern imparted to the beam PB is projected onto a target portion C. In this mode, generally a pulsed radiation source is employed and the programmable patterning device is updated as required after each movement of the substrate support structure WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
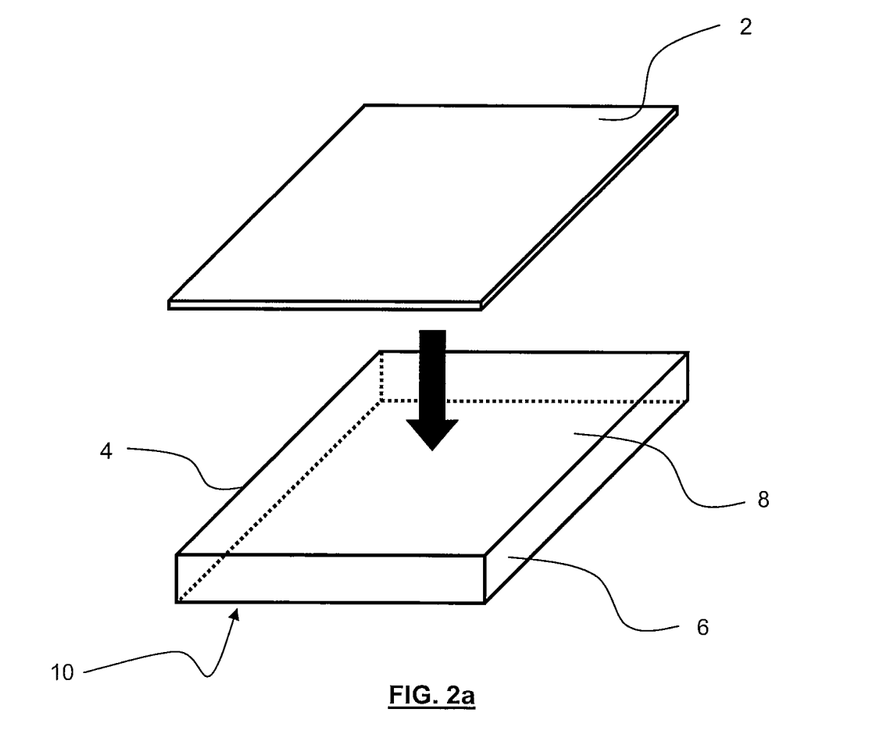
FIGS. 2a and 2b schematically depict, in use, the relative orientation of the first and second parts of the substrate support structure shown in FIGS. 2a and 2b.
Figure 2B:
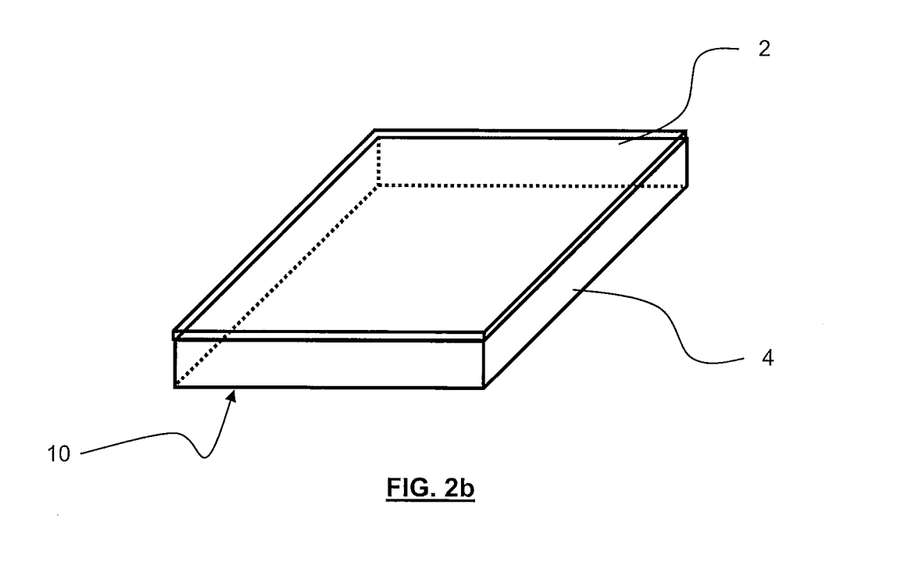

FIGS. 2a and 2b schematically depict a substrate support structure which may be used to support and hold a substrate in the lithographic apparatus shown in FIG. 1. FIG. 2a shows that a first part 2 of the substrate support structure has a plate-like shape. The first part 2 of the substrate support structure is arranged to hold a substrate (not shown). Although not shown in the Figure, the first part 2 of the substrate support structure may be provided with an array of burls or protrusions upon which a substrate may rest. The first part 2 of the substrate support structure is often referred to as a wafer table or a substrate table.

FIG. 2a also shows a second part 4 of the substrate support structure. The second part 4 of the substrate support structure is arranged to support and hold the first part 2 of the substrate support structure. The second part 4 of the substrate support structure may be connected to or house actuators for controlling movement of the second part 4 of the substrate support structure, and therefore movement of the first part 2 of the substrate support structure. The second part 4 of the substrate support structure may be provided with mirrors or gratings for use with interferometers or encoders, for example to allow accurate positioning of the second part 4 of the substrate support structure. The second part 4 of the substrate support structure is sometimes referred to as a chuck, or a mirror block.

It is sometimes necessary to have to accelerate or decelerate the second part 4 of the substrate support structure, for example when moving the second part 4 of the substrate support structure to position or re-position a substrate located on the first part 2 of the substrate support structure. In order to make the task of acceleration and deceleration easier, the second part 4 of the substrate support structure may be designed such that its weight is, where possible, reduced. In order to achieve such a weight reduction, the second part 4 of the substrate support structure is designed as an open-box structure. This means that instead of being a solid lock or mass of material, the second part 4 of the substrate support structure is instead provided with side walls 6 and an enclosing face 8. It can be seen that such an arrangement creates a box having an open end 10, or in other words an open-box structure. By creating an open-box structure, the structural integrity of the second part 4 of the substrate support structure is substantially maintained, while ensuring that the weight of the second part 4 of the substrate support structure is as low as possible, therefore making it easier to accelerate and decelerate the second part 4 of the substrate support structure.

In use, the first part 2 of the substrate support structure may be mounted on and attached to the second part 4 of the substrate support structure (FIGS. 2a and 2b). The second part 4 of the substrate support structure is orientated such that the first part 2 of the substrate support structure may be mounted and attached to the enclosing face 8 of the second part 4 of the substrate support structure. When the first part 2 of the substrate support structure is mounted on and attached to the second part 4 of the substrate support structure, the open end 10 of the second part 4 of the substrate support structure is not enclosed and is not enclosed by the first part 2 of the substrate support, and remains open.

The first part 2 of the substrate support structure may be attached to the second part 4 of the substrate support structure using a vacuum clamp or the like, as is known in the art. When the second part 4 of the substrate support structure undergoes high acceleration or deceleration, for example when moving the substrate support structure between different positions, the force provided by the vacuum clamp may not be sufficient to ensure that there is no relative movement between the first part 2 of the substrate support structure and second part 4 of the substrate support structure. This means that during acceleration and deceleration of the substrate support structure, there may be relative movement, or in other words slip, between the first part 2 of the substrate support structure and second part 4 of the substrate support structure. This relative movement, or slip, depends on the roughness of the first part 2 of the substrate support structure and the second part 5 of the substrate support structure at the interface between them, and also the pre-load stress in the interface between the first part 2 of the substrate support structure and second part 6 of the substrate support structure.

Relative movement between the first part 2 of the substrate support structure and second part 4 of the substrate support structure is undesirable. This is because any relative movement may lead to inaccurate alignment of a substrate located on the first part 2 of the substrate support structure with respect to a radiation beam which is to be used, or is being used, to apply a pattern to the substrate. Such relative movement can therefore cause patterns to be inaccurately applied to the substrate, and in the case of patterns overlaid on top of one another on the substrate, this can cause or increase overlay areas between overlaid patterns. As well as the acceleration and deceleration of the second part 4 of the substrate support structure directly causing relative movement or slip between the first part 2 of the substrate support structure and second part 4 of the substrate support structure, the acceleration and deceleration can also cause such relative movement in an indirect manner. For example, acceleration and deceleration of the second part 4 of the substrate support structure can cause the open-box structure of the second part 4 of the substrate support structure to distort. Such distortion can also lead to relative movement between the first part 2 of the substrate support structure and second part 4 of the substrate support structure. This can also lead to inaccurate alignment of the substrate with respect to radiation beam, and therefore the misalignment of patterns on the substrate and/or the creation or increase of overlay areas between successively overlaid patterns.

Figure 3A:
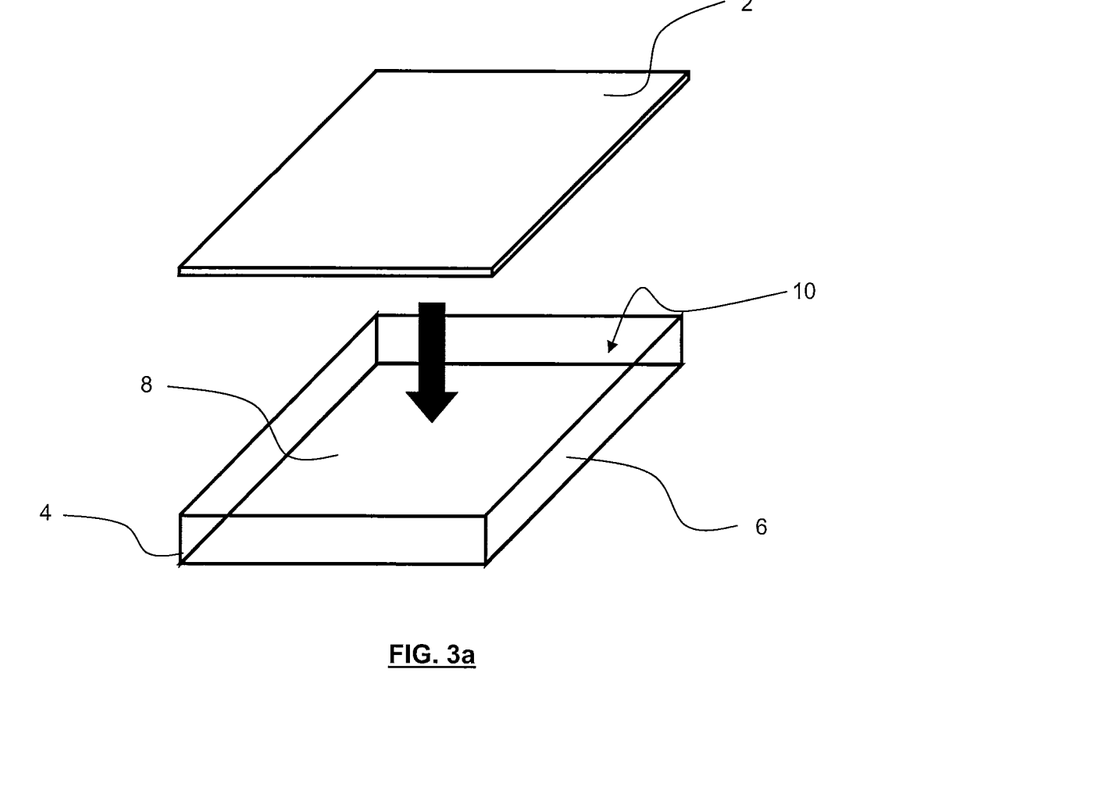
FIGS. 3a and 3b schematically depict the relative orientation of first and second parts of a substrate support structure according to an embodiment of the present invention.

According to an embodiment of the present invention, the relative orientation of the first part 2 of the substrate support structure and the second part 4 of the substrate support structure can be changed to obviate or mitigate at least one of the aforementioned problems. This is shown in FIG. 3a. According to an embodiment of the present invention (FIG. 3a), the first part 2 of the substrate support structure is mounted on and attached to the side walls 6 which define the open end 10 of the second part 4 of the substrate support structure. This is in stark contrast to the prior art arrangement (shown in FIGS. 2a and 2b), where the first part 2 of the substrate support structure was not mounted on to the open end 10 of the second part 4 of the substrate support structure, but was instead mounted on to the enclosing face 8 of the second part 4 of the substrate support structure.

Figure 3B:
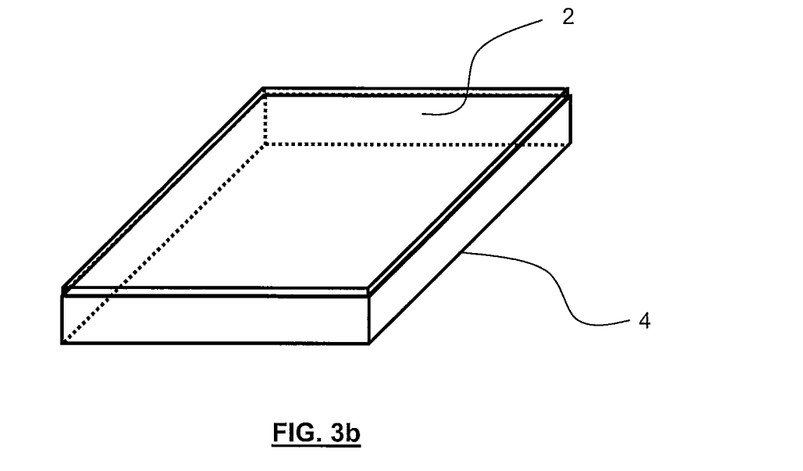

FIG. 3b shows the resultant substrate support structure when the first part 2 of the substrate support structure has been mounted on and attached to the second part 4 of the substrate support structure according to the principles discussed in relation to FIG. 3a.

In the embodiment (FIG. 3b) the substrate support structure no longer forms an open-box structure. This is because the open-box structure of the second part 4 of the substrate support structure has been enclosed by the mounting and attachment of the first part 2 of the substrate support structure. As is known in structural engineering and the like, a closed-box structure is much stiffer and therefore resilient to distortion and deformation than an open-box structure. Therefore, if the first part 2 of the substrate support structure and the second part 4 of the substrate support structure are mounted and attached to one another according to the embodiment (FIGS. 3a and 3b), the resultant substrate support structure will be stiffer and more resilient to deformation and distortion than the substrate support structure according to the prior art (FIG. 2b). Since according to an embodiment of the present invention the distortion of the substrate support structure is reduced, the misalignment of patterns applied to a substrate (located on the first part 2 of the substrate support structure), or the overlay errors in those patterns, will be reduced.

The first part 2 of the substrate support structure may be attached to the second part 4 of the substrate support structure in any appropriate manner. For example, the first part 2 of the substrate support structure may be attached to the second part 4 of the substrate support structure using an adhesive such as a glue, an electrostatic clamp arrangement, a vacuum clamp arrangement, or a mechanical fixing arrangement. In an embodiment, the arrangement used to attach the first part 2 of the substrate support structure to the second part 4 of the substrate support structure comprises a releasable fastening arrangement, so that the first part 2 of the substrate support structure and the second part 4 of the substrate support structure can be easily attached to one another and detached from one another. The releasable fastening arrangement may comprise a vacuum clamp arrangement, an electrostatic clamping arrangement, or a mechanical clamping arrangement. In some applications a vacuum or electrostatic clamp arrangement may be sufficient to ensure that any relative movement or slip between the first part 2 of the substrate support structure and second part 4 of the substrate support structure during acceleration or deceleration of the second part 4 of the substrate support structure is reduced or eliminated. However, in some circumstances this may not be possible, and so a mechanical clamping arrangement which is able to reduce or eliminate such relative movement may be useful because of the capacity to exert a large clamping force.

A mechanical clamping (or in other words fixing or connecting) arrangement may comprise any suitable mechanical clamping configuration, for example the use of bolts, a vice-like arrangement, screws etc. The use of bolts or screws may be a simpler arrangement to implement than a vice like arrangement. The terms 'bolts' and 'screws' are considered to be synonymous in the context of the application. The terms 'bolting' and 'screwing' are also considered to be synonymous in the context of the application. The mechanical clamping arrangement may have some inherent built-in flexibility, so that even though the first part 2 of the substrate support structure and second part 4 of the substrate support structure are held together, different degrees of expansion are allowed in the different substrate support structure parts. For instance, the mechanical clamping arrangement may comprise springs, such as leaf springs, to provide the flexibility. The mechanical clamping (or in other words fixing or connecting) arrangement may extend between the first part 2 of the substrate support structure and second part 4 of the substrate support structure in such a way that the mechanical clamping arrangement (e.g. bolt or screw) extends parallel to sidewalls of at least one of the first part 2 of the substrate support structure and second part 4 of the substrate support structure. Alternatively, a region of the first part 2 of the substrate support structure may sit inside a region of the second part 4 of the substrate support structure (i.e. such that the second part overlaps the first). Alternatively, a region of the second part 4 of the substrate support structure may sit inside a region of the first part 2 of the substrate support structure (i.e. such that the first part overlaps the second). In such overlapping configurations, the mechanical clamping arrangement (e.g. bolt or screw) may be oriented to extend perpendicularly between the sidewalls of the first part 2 of the substrate support structure and second part 4 of the substrate support structure, and/or radially to a centre (e.g. a common centre) of the of the first part 2 of the substrate support structure and second part 4 of the substrate support structure. When the mechanical clamping arrangement (e.g. bolt or screw) extends in such a perpendicular or radial manner, the mechanical clamping arrangement may be configured to prevent or limit tangential movement, or out of plane movement, but allow some degree of radial movement, for example to allow for differential radial (e.g. thermal) expansion of the of the first part 2 of the substrate support structure and second part 4 of the substrate support structure. This may be achieved by locating the mechanical clamping arrangement in a channel or guide, which restricts or prevents tangential or out of plane movement, but allows radial movement.

Figure 4A:
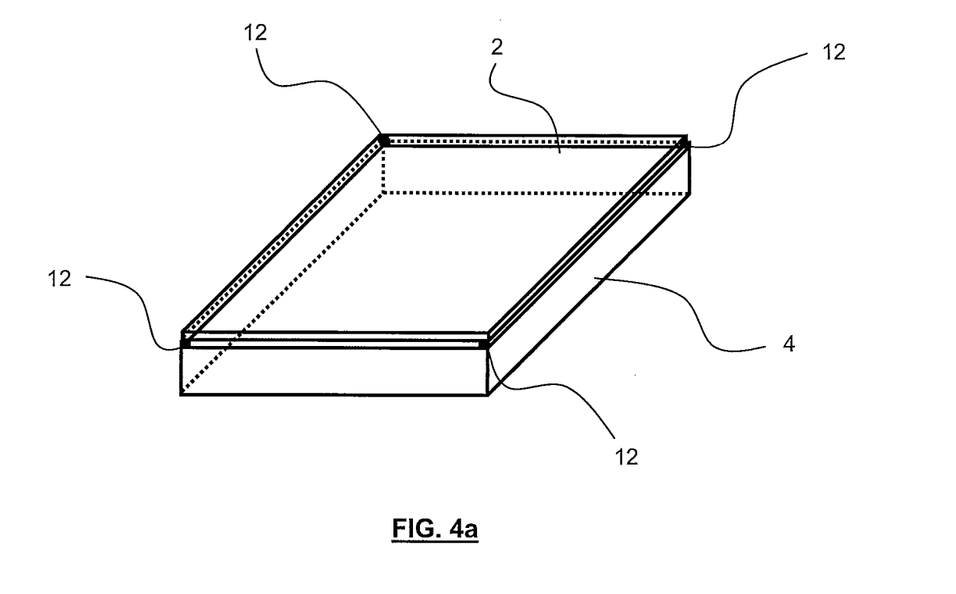
FIGS. 4a and 4b schematically depict different arrangements for attaching a first part of a substrate support structure to a second part of a substrate support structure in accordance with embodiments of the present invention.

In an embodiment of the invention the first part 2 of the substrate support structure is attached to the second part 4 of the substrate support structure using four releasable fastening arrangements 12 (FIG. 4a). In this embodiment, the releasable fastening arrangements are bolts 12, but as described above can be any other releasable fasteners. In an embodiment, the releasable fasteners are torque-free releasable fasteners, for example a torque-free bolt or other arrangement, in order to reduce or eliminate any torque applied to the substrate support structure by the releasable fastening arrangement. The bolts are located at each corner of the first part 2 of the substrate support structure and the second part 4 of the substrate support structure (FIG. 4a). This means that the corners of the first part 2 of the substrate support structure are attached to the corners 4 of the substrate support structure. By locating the bolts 12 in this way, the closed-box structure formed by attaching the first part 2 of the substrate support structure to the second part 4 of the substrate support structure is very stiff.

In the embodiment the first part 2 of the substrate support structure is optimized for not wearing and having high thermal conductance by comprising a first material. The second part 4 of the substrate support structure is optimized by having a low coefficient of thermal expansion by comprising a second material. The use of different materials may be used to ensure that the first part 2 and the second part 4 of the substrate support structure expand and shrink with different rates in use.

Figure 4B:
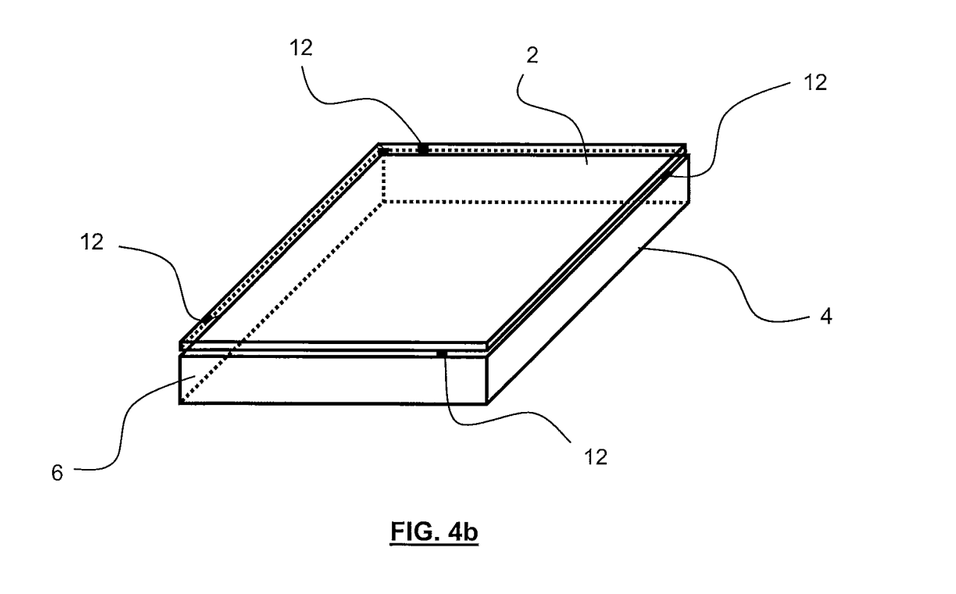

One disadvantage with the arrangement of this embodiment (FIG. 5a) is that by locating the bolts 12 in the corners of the first part 2 of the substrate support structure and second part 4 of the substrate support structure thermal stress may be introduced at the location of the bolts 12. This thermal stress can be reduced or eliminated by locating the fastening arrangements, which as explained are, in an embodiment, releasable fastening arrangements such as bolts, away from the corners of the first part 2 of the substrate support structure and the second part 4 of the substrate support structure. In an alternative embodiment (FIG. 4b) the bolts 12 are located part way along the side walls 6 of the second part 4 of the substrate support structure which define the opening which the first part 2 of the substrate support structure encloses. By locating the bolts 12, or other releasable fasteners, away from the corners, the side walls 6 can accommodate (or in other words catch up) expansion differences between the first part 2 of the substrate support structure and second part 4 of the substrate support structure by small (e.g. of the order of micrometer) elastic out-of-plane deformation, and without affecting the in-plane stiffness of the substrate support structure.

At the point where a bolt 12 is located, two degrees of freedom (in plane) are fixed. In a rectangular shaped box of the current embodiment (FIG. 4b), four such locations where the first part 2 of the substrate support structure is attached to the second part 4 of the substrate support structure are used (i.e. one releasable fastening arrangement for each side of the box), since an open-box structure has two internal degrees of freedom additional to the normal 6 degrees of freedom. As a result, it will be understood that the use of three releasable fasteners for a substrate support structure having rectangular box-like shape (i.e. having four sides) would not generally lead to a sufficiently stiff structure.

Figure 5:
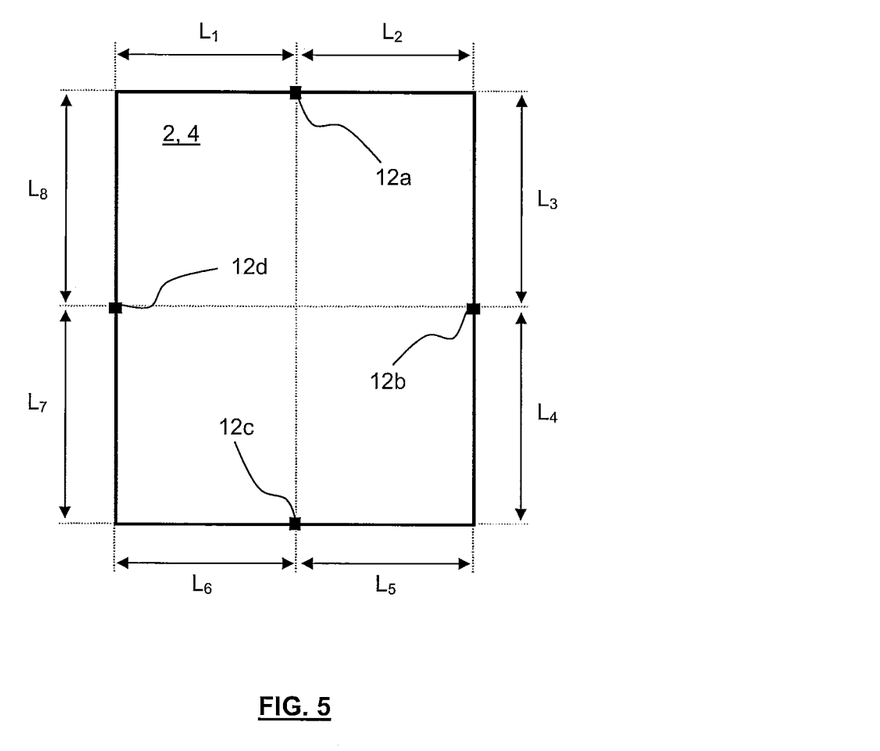
FIG. 5 schematically depicts principles associated with the arrangements shown in FIGS. 4a and 4b.

FIG. 5 depicts a plan view of the first part 2 of the substrate support structure and second part 4 of the substrate support structure together with the location of bolts 12a, 12b, 12c, 12d attaching the parts 2, 4 of the substrate support structure to one another. A transmission ratio T can be determined for the closed-box structure formed by the first part 2 of the substrate support structure and second part 4 of the substrate support structure. The transmission ratio T can be determined by taking the product of the relative positions of the bolts 12a, 12b, 12c, 12d along each side of the substrate support structure. For instance, the relative location of a first bolt 12a along a first side of the substrate support structure can be defined by the ratio of the distances from the location of the first bolt 12a to each corner of the sidewall on which the bolt 12a is fixed. In other words, a ratio $i_1$ can be defined as:

$$i_1 = L_1/L_2$$

where $L_1$ and $L_2$ are the distances from the location of the first bolt 12a to the corners of the sidewall on which the first bolt 12a is located.

Similarly, further ratios $i_2$, $i_3$, $i_4$ can be established for a second bolt 12b, a third bolt 12c, and a fourth bolt 12d:

$$i_2 = L_3/L_4$$

$$i_3 = L_5/L_6$$

$$i_4 = L_7/L_8$$

The transmission ratio for the entire substrate support structure can be defined as the product of all of these ratios:

$$T = i_1 \cdot i_2 \cdot i_3 \cdot i_4$$

If this transmission ratio T is equal to one, an internal degree of freedom is introduced into the substrate support structure, resulting in a lower stiffness of into the substrate support structure. It can be seen from the definition of the transmission ratio T that a transmission ratio of 1 can be achieved if the bolt 12a, 12b, 12c, 12d were inappropriately located on each side of the support structure. For instance, it can be seen that if $i_1$ is the inverse of $i_3$, and $i_2$ the inverse of $i_4$, the resultant transmission ratio will be equal to 1. If the resultant closed-box structure of the substrate support structure is to be as stiff as possible, while still allowing for the accommodation of thermal expansion of different parts of the substrate support structure (as described above), location of the releasable fasteners should be chosen to ensure that the transmission ratio T is not equal to 1. In an embodiment, the transmission ratio is smaller than 0.9 or larger than 1.1. In a particular implementation, the transmission ratio is smaller than 0.5 or larger than 1.5.

Figure 6A:
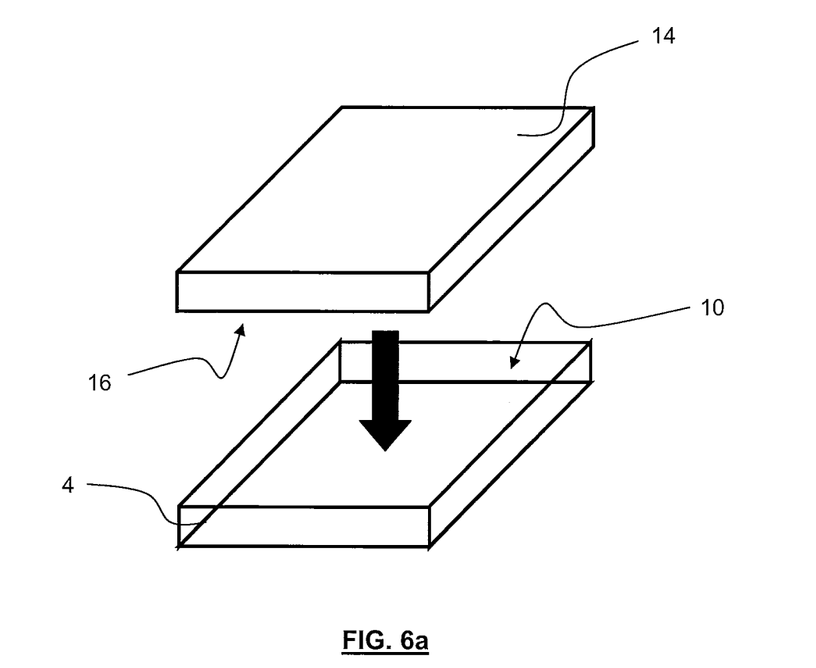
FIGS. 6a and 6b schematically depict other support structures to which embodiments of the present invention are applicable.

In the embodiments described above, the first part of the substrate support structure upon which a substrate may be located has been described as being plate-like in shape. However, alternative shapes are possible. For instance a first part 14 of the substrate support structure may have an open-box structure (FIG. 6a), in that it defines an opening 16. The openings 16, 10 of the first part 14 of the substrate support structure and second part 4 of the substrate support structure can be orientated to face one another, such that when mounted together and attached to one another the resultant substrate support structure forms a closed-box structure.

Figure 6B:
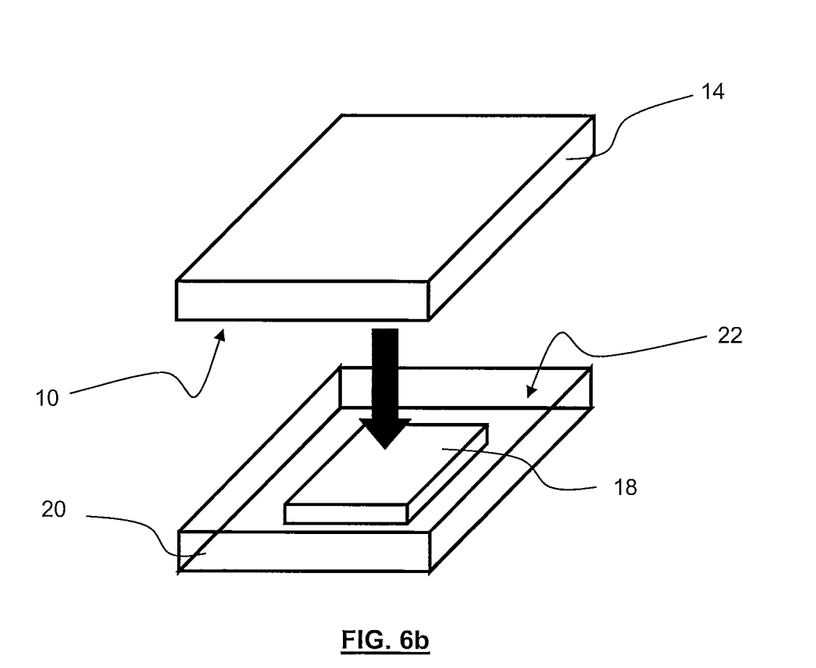

The second part 20 of the substrate support structure may be provided with an actuator 18 (FIG. 6b). The second part 20 of the substrate support structure is formed by a housing 20 of the actuator 18. The housing 20 has an open-box structure and defines an opening 22. By appropriate orientation of the housing 20 and opening 22, and also appropriate orientation of the first part 14 of the substrate support structure and its opening 16, the first part 14 of the substrate support structure and the second part 20 of the substrate support structure (which now contains an actuator) can be mounted and attached to one another in order to create a closed-box structure.

It will be appreciated that the closed-box structure principle is not limited to a substrate support structure. The closed-box structure principle may also be applied to other elements of the lithographic apparatus which undergo high acceleration in the lithographic apparatus. The patterning device support structure is such a structure which undergoes high acceleration in the lithographic apparatus. In the case of a reflective patterning device, the patterning device support structure may take the form and structure as described above in relation to the substrate support structures according to the invention (FIGS. 3 to 6). In other words, the patterning device support structure may comprise a first part on which the patterning device is to be located and a second part which is arranged to support this first part. The second part may, for example, house an actuator or the like for effecting movement of the second part of the patterning device support structure, and therefore movement of the first part of the patterning device support structure and the patterning device itself.

Figure 7:
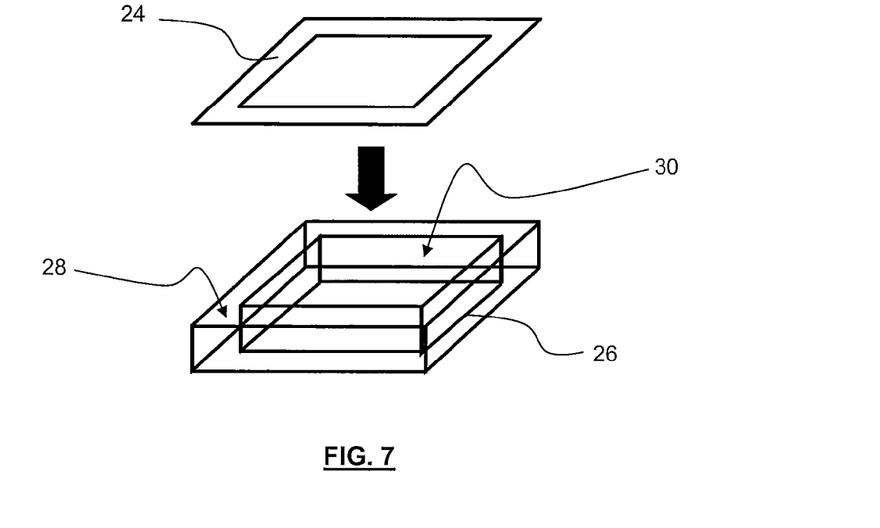
FIG. 7 schematically depicts a patterning device support structure in accordance with an embodiment of the present invention.

In the case of a transmissive patterning device, the arrangement and structures described in above embodiments of the invention (FIGS. 3 to 6) may not be appropriate, since they do not define an opening, or in other words a window, through which a radiation beam may pass after it has passed through the transmissive patterning device. In an embodiment of the invention this problem is overcome (FIG. 7). In this embodiment a first part 24 of a patterning device support structure and a second part 26 of a patterning device support structure are provided. The second part 26 of the patterning device support structure 26 has an open-box structure which defines an opening 28. The open-box structure is shaped to define a window 30 (or in other words an opening which extends through the second part 26 of the patterning device support structure) through which, for example, a radiation beam may pass. The opening 28 of the second part 26 of the patterning device support structure may be enclosed by the first part 24 of the patterning device support structure, which has a shape which corresponds to the opening 28.

As described above in relation to the substrate support structure, the patterning device support structure will have an increased stiffness when its constituent open-box parts come together to form a closed box structure. As described above in relation to the substrate support structure, the first part 24 of the patterning device support structure may be plate-like in shape, or may also have an open-box structure which when appropriately oriented and attached to the open-box structure of the second part 26 of the patterning device support structure forms a closed-box structure. The patterning device support structure may have one or more of the features discussed above in relation to the substrate support structure.

Figure 8A:
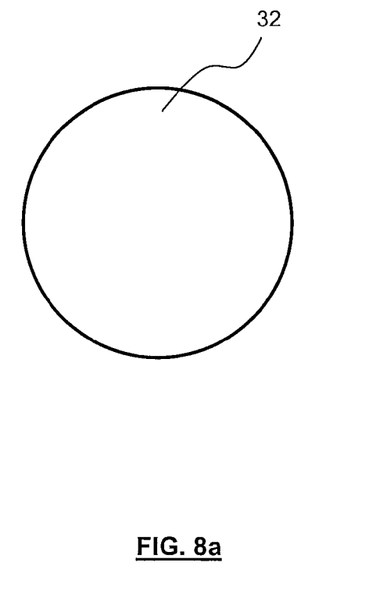
FIGS. 8a and 8b schematically depict principles associated with embodiments of the present invention where the support structure has curved, as opposed to straight, sidewalls.

In the embodiments described above, the open-box structures, or the structures which enclose them, have been illustrated as being square or rectangular in shape. These shapes have straight sidewalls or edges. Other shapes are possible. An open-box structure, or a structure which is used to enclose this open-box structure, may be curved in shape, and for example be circular (giving a circular structure) or elliptical, or have one or more curved sidewalls. FIG. 8a shows a circular structure 32 in plan view. In order to determine the locations of releasable fasteners between two circular structures, it is necessary to identify the transmission ratio T as discussed above in relation to previous embodiments. However, it will be appreciated that a circular or elliptical structure has only one side. Therefore, it is not possible to determine how far along each side of the circular structure 32 a bolt 12 is located. In order to determine the transmission ratio of a circular or elliptical structure, it is therefore necessary to establish a 'virtual' two-dimensional polygon which takes into account the positions of the bolts 12 or other fastening arrangements located on the edge of the circular structure 32. It will be appreciated that the open-box structure, or the structures which form the open-box structure, may be one of a number of shapes, for example pentagonal, hexagonal, octagonal, etc.

Figure 8B:
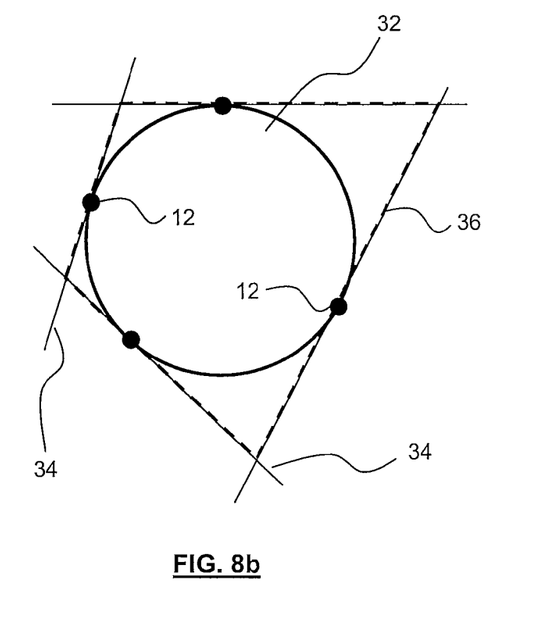

In a plan view lines 34 can be drawn which intersect the location of a bolt 12 and which are tangential to the circular structure 32 at the position of the bolt 12 (FIG. 8b). A two-dimensional polygon structure 36 is formed by the points of intersection of the tangential lines 34. The transmission ratio can then be calculated as described above in relation to this polygon, in that the location of the bolts can be determined relative to the sides of this polygon 36. Appropriate locations of the releasable fasteners (e.g. bolts 12) can therefore be calculated.

In summary, it will be appreciated that the embodiments of the present invention relate to forming a closed box structure from first and second parts of a substrate support structure and/or a patterning device support structure, one or both parts in isolation forming an open-box structure. The resultant closed-box structure is stiffer than an open box structure. Furthermore, these parts may be attached to one another using one or more fastening arrangements which may be releasable. Releasable fastening arrangements allow for the parts to be readily attached to and detached from one another, and to reduce the relative movement between those parts during acceleration or deceleration.

While specific embodiments of the invention have been described above, it will be appreciated that the invention may be practiced otherwise than as described. The description is not intended to limit the invention.

The invention claimed is:

1. A support structure for supporting an exchangeable patterning structure for patterning a beam of radiation to produce a patterned beam of radiation for lithographic exposure of a substrate in a lithographic exposure apparatus comprising:

a first support structure part and a second support structure part, the first support structure part being arranged to support the patterning structure during a lithographic exposure of the substrate, and the second support structure part being arranged to, at least in part, support the first support structure part during the lithographic exposure of the substrate, at least one of the first support structure part and the second support structure part having an open-box structure, and wherein the first support structure part and the second support structure part are configured to be attached to one another in such a way that the first support structure part and the second support structure part together form a closed-box structure and further being configured and arranged to allow the lithographic exposure of the pattern onto the substrate without removal of either the first support structure part or the second support structure part.

2. A support structure according to claim 1, comprising a fastening arrangement to attach the first support structure part and the second support structure part to each other.

3. A support structure as recited in claim 2, wherein the fastening arrangement is a releasable fastening arrangement.

4. A support structure as recited in claim 3, wherein the releasable fastening arrangement comprises one or more bolts or screws.

5. A support structure as recited in claim 2, wherein the fastening arrangement is arranged to attach the first support structure part and the second support structure part and at least one respective sidewall portion of the open-box structure.

6. A support structure as recited in claim 5, wherein the open box structure comprises a plurality of sidewalk and each sidewall is provided with at least one respective fastening arrangement.

7. A support structure as recited in claim 6, wherein the at least one respective fastening arrangement is located on one or more sidewalls of the open-box structure in a position for fixing the object with respect to two internal degrees of freedom relative to the open-box structure.

8. A support structure as recited in claim 6, wherein the at least one respective fastening arrangement is located on one or more sidewalls of the open-box structure in positions which result in a mechanical transmission ratio for the open-box structure not being equal to 1.

9. A support structure as recited in claim 8, wherein the transmission ratio is smaller than 0.9 or larger than 1.1.

10. A support structure as recited in claim 9, wherein the transmission ratio is smaller than 0.5 or larger than 1.5.

11. The support structure as recited in claim 1, wherein the first support structure part comprises a mask table or a reticle table.

12. A support structure as recited in claim 1, wherein the first support structure part and the second support structure part define a transmissive portion through which at least a part of the radiation beam may pass during the lithographic exposure of the substrate.

13. A support structure as recited in claim 1, wherein the second support structure part comprises an actuator for effecting movement of the exchangeable patterning structure.

14. A support structure as recited in claim 13, wherein the actuator is provided with a housing which forms the open-box structure.

15. A support structure as recited in claim 1, wherein the open-box structure is formed from at least one sidewall and an enclosing face, leaving the open-box structure with an opening at an end of the open-box structure.

16. A support structure as recited in claim 15, wherein the open-box structure has one or more sidewalls.

17. A support structure as recited in claim 1, wherein the open-box structure has at least one corner, wherein the first support structure part and the second support structure part are attached to one another at one or more of the corners.

18. A support structure as recited in claim 17, wherein the first support structure part and the second support structure part are attached to one another at all of the corners.

19. A support structure as in claim 1, wherein one or more sidewalls of the support structure are curved.

20. A method of attaching together first and second parts of a support structure for use in a lithographic apparatus to support an exchangeable object, the first support structure part being arranged to support an object, and the second support structure part being arranged to, at least in part, support the first support structure part, at least one of the first support structure part and the second support structure part having an open-box structure, and wherein the method comprises:

attaching the first and second parts of the support structure to one another in such a way that the first support structure part and the second support structure together form a closed-box structure;

placing the closed-box structure holding the exchangeable object in a beam path of the lithographic apparatus; and performing an exposure operation with the lithographic apparatus while the first and second parts are attached and the closed-box structure is holding the exchangeable object in the beam path.

* * * * *